(12) United States Patent
Sanga et al.

(10) Patent No.: US 10,974,492 B2
(45) Date of Patent: *Apr. 13, 2021

(54) LIGHT EMITTING DEVICE AND METHOD OF MANUFACTURING LIGHT EMITTING DEVICE

(71) Applicant: NICHIA CORPORATION, Anan (JP)

(72) Inventors: Daisuke Sanga, Tokushima (JP); Masatsugu Ichikawa, Tokushima (JP); Shunsuke Minato, Anan (JP); Toru Takasone, Tokushima (JP); Masahiko Sano, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/795,008

(22) Filed: Feb. 19, 2020

(65) Prior Publication Data
US 2020/0180292 A1   Jun. 11, 2020

Related U.S. Application Data

(60) Continuation of application No. 15/883,810, filed on Jan. 30, 2018, now Pat. No. 10,603,889, which is a
(Continued)

(30) Foreign Application Priority Data

Nov. 7, 2013  (JP) .................................. 2013-231009
Oct. 28, 2014  (JP) .................................. 2014-219171

(51) Int. Cl.
*F21V 21/00* (2006.01)
*B32B 38/00* (2006.01)
(Continued)

(52) U.S. Cl.
CPC .......... *B32B 38/0004* (2013.01); *B32B 37/02* (2013.01); *H01L 33/0093* (2020.05);
(Continued)

(58) Field of Classification Search
CPC ..................... B32B 2307/412; F21Y 2109/00
(Continued)

(56) References Cited

U.S. PATENT DOCUMENTS 9,914,288 B2 *   3/2018   Sanga ..................... H01L 33/60
10,603,889 B2 *  3/2020   Sanga ................. H01L 33/0093
(Continued)

FOREIGN PATENT DOCUMENTS

JP       2008277592 A    11/2008
JP       2010-157638 A    7/2010
(Continued)

*Primary Examiner* — Laura K Tso
(74) *Attorney, Agent, or Firm* — Squire Patton Boggs (US) LLP

(57) ABSTRACT

A light emitting device can further improve light extraction efficiency. A method of manufacturing such a light emitting device can also prove advantageous. The light emitting device includes a light emitting element, a light-transmissive member which is disposed on a light extracting surface side of the light emitting element, and a reflecting layer disposed on an element bonding surface of the light transmissive member where the light emitting element is disposed and adjacent to the light emitting element. The light-transmissive member, in a plan view, has a planar dimension greater than the light extracting surface of the light emitting element.

15 Claims, 8 Drawing Sheets

Related U.S. Application Data division of application No. 14/534,614, filed on Nov. 6, 2014, now Pat. No. 9,914,288.

(51) Int. Cl.
 *B32B 37/02* (2006.01)
 *H01L 33/58* (2010.01)
 *H01L 33/60* (2010.01)
 *H01L 33/00* (2010.01)

(52) U.S. Cl.
 CPC .............. *H01L 33/58* (2013.01); *H01L 33/60* (2013.01); *B32B 2305/55* (2013.01); *B32B 2307/412* (2013.01); *B32B 2551/00* (2013.01)

(58) Field of Classification Search
 USPC ................... 362/293, 249.02, 311.02
 See application file for complete search history.

(56) References Cited

U.S. PATENT DOCUMENTS

| | | | |
|---|---|---|---|
| 2007/0159806 A1* | 7/2007 | Fujino | H04N 1/0289 362/97.4 |
| 2010/0259159 A1 | 10/2010 | Seaman | |
| 2011/0297983 A1 | 12/2011 | Nishiuchi et al. | |
| 2012/0104452 A1 | 5/2012 | Miyoshi et al. | |
| 2012/0261700 A1 | 10/2012 | Ooyabu et al. | |
| 2013/0015483 A1 | 1/2013 | Shimokawa et al. | |
| 2013/0334539 A1 | 12/2013 | Kojima et al. | |
| 2014/0239320 A1 | 8/2014 | Miyoshi et al. | |
| 2015/0270456 A1 | 9/2015 | Miyoshi et al. | |
| 2015/0340567 A1 | 11/2015 | Ichikawa | |
| 2015/0364660 A1 | 12/2015 | Huang et al. | |
| 2016/0133800 A1 | 5/2016 | Miyoshi et al. | |
| 2018/0040785 A1 | 2/2018 | Peng et al. | |

FOREIGN PATENT DOCUMENTS

| | | |
|---|---|---|
| JP | 2011211082 A | 10/2011 |
| JP | 2011258671 A | 12/2011 |
| JP | 2012-069577 A | 4/2012 |
| JP | 2012099544 A | 5/2012 |
| JP | 2012-119481 A | 6/2012 |
| JP | 2012-146942 A | 8/2012 |
| JP | 2012-195345 A | 10/2012 |
| JP | 2012-222319 A | 11/2012 |
| JP | 2013-021175 A | 1/2013 |

\* cited by examiner

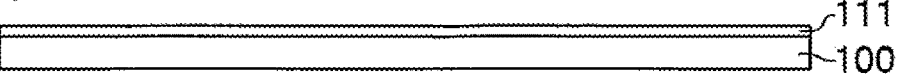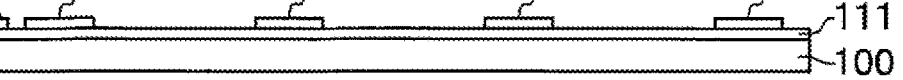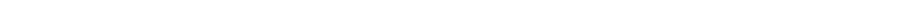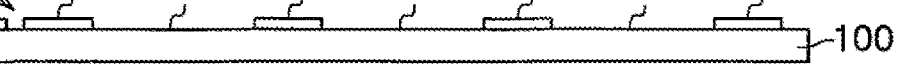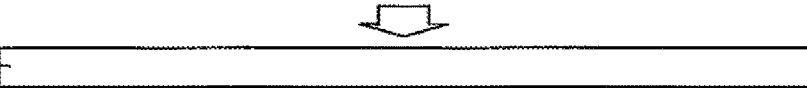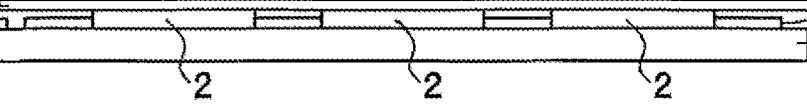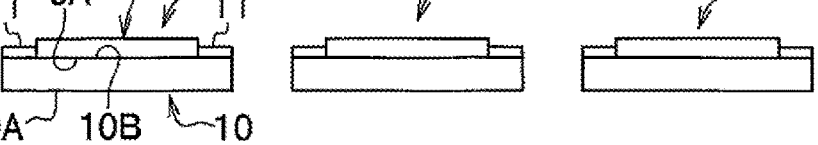

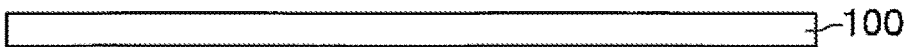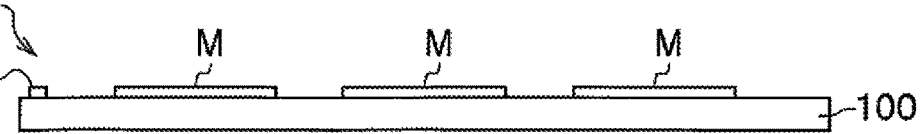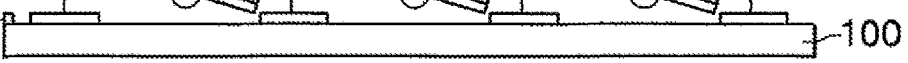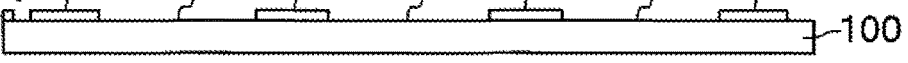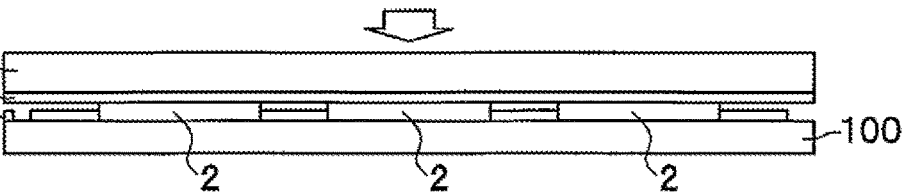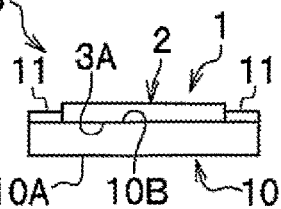

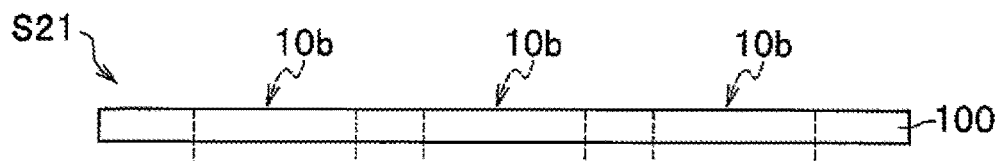
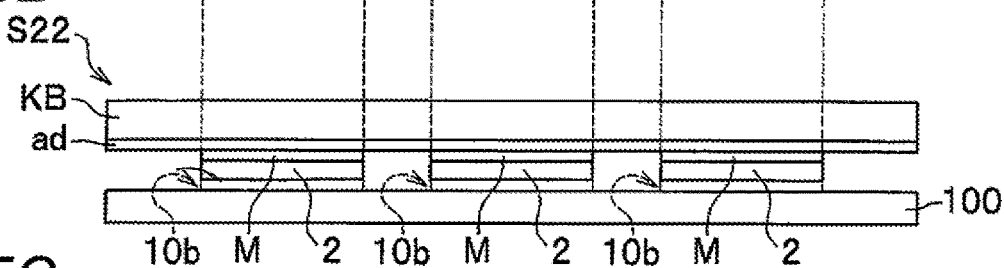
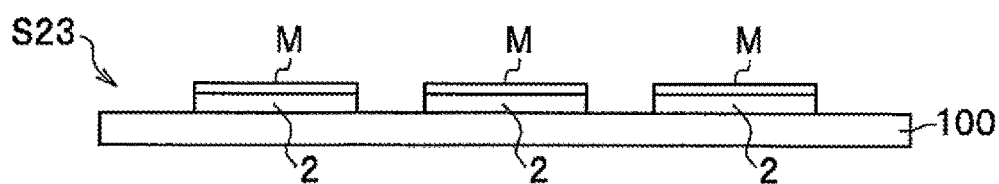
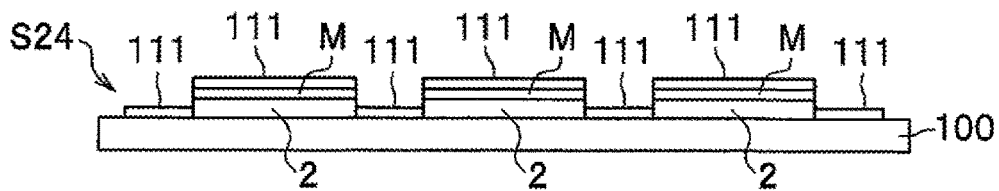
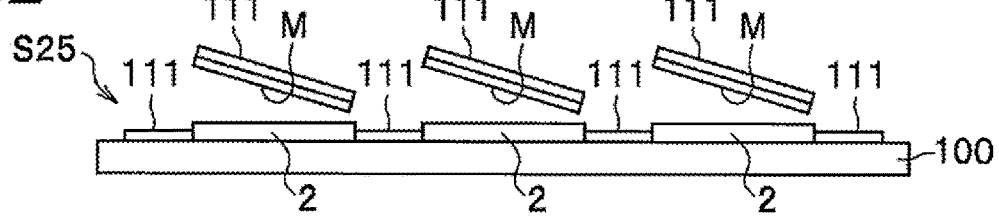
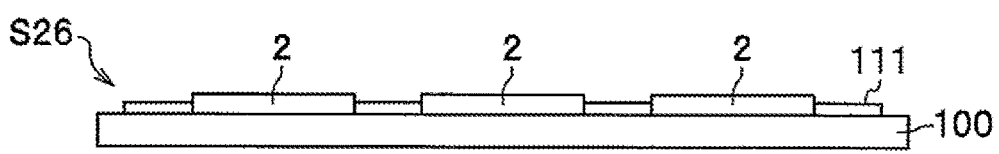
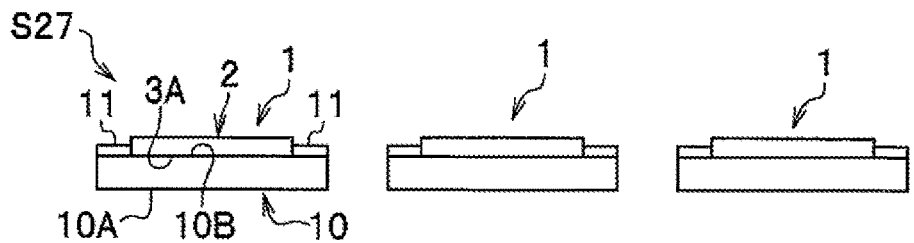

LIGHT EMITTING DEVICE AND METHOD OF MANUFACTURING LIGHT EMITTING DEVICE

CROSS REFERENCE TO RELATED APPLICATION

This application is a continuation of co-pending U.S. application Ser. No. 15/883,810, filed on Jan. 30, 2018, which is a divisional of U.S. application Ser. No. 14/534,614 (now U.S. Pat. No. 9,914,288), filed on Nov. 6, 2014, which claims priority to Japanese Patent Application No. 2013-231009, filed on Nov. 7, 2013, and Japanese Patent Application No. 2014-219171, filed on Oct. 28, 2014. The content of all of the above applications are hereby incorporated herein by reference.

BACKGROUND

Field

The present disclosure relates to a light emitting device which uses a light emitting element and a method of manufacturing the light emitting device.

Description of Related Art

Generally, a light emitting device having a light emitting element such as an LED has been required to improve the light extracting efficiency of white light. There has been known a light emitting device to obtain the above, which includes a configuration for increasing the light extracting efficiency of white light at the light extracting surface side of the light emitting element. For example, a semiconductor light emitting element illustrated in JP 2012-119481A has a nitride substrate and a semiconductor layer portion formed on a main surface of the nitride substrate. In the semiconductor light emitting element, the nitride substrate has an inclined exposed surface or an inclined exposed portion.

In the semiconductor light emitting element, the semiconductor layer portion has a quantum well structure active layer which includes a quantum well layer and a barrier layer. In the case where the quantum well layer, the barrier layer, and a second conductive-type semiconductor layer have an appropriate difference in the refractive index, and also the light emitting layer has an appropriate thickness, the semiconductor light emitting element has an anisotropic internal light emitting profile due to isotropic dipole emission. That is, according to JP 2012-119481A, in order to efficiently extract light which is emitted from the active layer structure of the semiconductor layer portion into the semiconductor light emitting element, it is advantageous to have a configuration in which an inclined exposed surface or an inclined exposed portion is provided on the nitride substrate to improve the light extraction efficiency of a high density light traveling in the vicinity of $\theta_{em\ max}$ direction (a direction indicates a maximum internal light emission intensity density in the target semiconductor light emitting element at the time of measurement of the light distributing properties.

Further, light travelling in the vicinity of $\theta_{em\ max}$ direction has a high density, so that mainly controlling the directions of this portion of light outside of the light emitting element is extremely important, which can be achieved by providing the nitride substrate with an inclined exposed surface or an inclined exposed portion (see JP 2012-119481A). Thus, according to JP 2012-119481A, while appropriately controlling the light distributing properties of a semiconductor light emitting element which can be formed on a nitride substrate, the light extraction efficiency can be also improved.

However, in such a semiconductor light emitting element, further consideration has been needed on the light reflected from an interface between a semiconductor layer portion and a nitride-based substrate and from the light extracting surface, and further, a portion of light reflected inward at the light extracting surface may be eliminated without being extracted from the light extracting surface.

SUMMARY

The present disclosure is directed in view of the disadvantages described above, and an object is to provide a light emitting device which can further improve light extraction efficiency, and a method of manufacturing the light emitting device.

In the exemplary embodiments, the light emitting device includes at least structures as set forth below. The light emitting device includes a light emitting element, a light transmissive member disposed on a light extracting surface side of the light emitting element, and a reflecting layer disposed on an element bonding surface of the light transmissive member where the light emitting element is disposed, and adjacent to the light emitting element. The light transmissive member in a plan view, has a planar dimension greater than the light extracting surface of the light emitting element.

Also, a first method of manufacturing the light emitting device described above includes, disposing a reflecting layer on a first surface side of a light transmissive member which is provided with a mask for the bonding positions of a plurality of light emitting elements. Bonding positions for the light emitting elements are prepared on the light transmissive member by removing the mask and the reflecting layer on the mask by way of lift-off. The light emitting elements are bonded after bonding each light extracting surface of the plurality of light emitting elements disposed on a supporting substrate, with the light extracting surfaces facing the respective bonding positions formed on the light transmissive member. The supporting substrate is removed, and the light emitting devices are singulated so that each portion of the light transmissive member having a light emitting element bonded thereon is larger than the light extracting surface of the light emitting element.

Also, a second method of manufacturing the light emitting device described above includes, disposing a reflecting layer on a first surface side of a light transmissive member which is provided with a mask for the bonding positions of a plurality of light emitting elements. Bonding positions for the light emitting elements are prepared on the light transmissive member by removing the mask and the reflecting layer on the mask by way of lift-off. The light emitting elements are bonded after bonding each light extracting surface of the plurality of light emitting elements disposed on a supporting substrate, with the light extracting surfaces facing the respective bonding positions formed on the light transmissive member. The supporting substrate is removed, and the light emitting devices are singulated so that each portion of the light transmissive member having a light emitting element bonded thereon is larger than the light extracting surface of the light emitting element.

Further, a third method of manufacturing the light emitting device described above includes, bonding a plurality of light emitting elements after bonding each light extracting surface of the light emitting elements disposed on a supporting substrate via a resist with the light extracting surfaces facing the respective bonding positions formed on the light transmissive member and removing the supporting substrate. A reflecting layer is disposed on the resist of the light transmissive member and the light emitting elements, and the resist is removed with the reflecting layer disposed on the resist by way of lift-off to expose the surfaces of the light emitting elements which are at the opposite side of the light extracting surfaces of the light emitting elements. The light emitting devices are singulated so that each portion of the light transmissive member having a light emitting element bonded thereon is larger than the light extracting surface of the light emitting element.

The light emitting device and the method of manufacturing the light emitting device according to the embodiments exhibit superior effects as described below. The light emitting device has a reflecting layer on the element bonding surface of the light transmissive member which is larger than the light extracting surface of the light emitting element, so that light returned from the light transmissive member without being extracted from the light extracting surface of the light transmissive member can be reflected at the reflecting layer to output from the light transmissive member, and thus the light extracting efficiency can be improved.

According to the methods of manufacturing a light emitting device described above, a reflecting layer is disposed on the light transmissive member, bonding the light extracting surface of the light emitting elements to the light transmissive member, and singulating the light emitting devices. Thus, light emitting devices with a high light extracting efficiency can be manufactured efficiently. According to the methods of manufacturing a light emitting device described above, a reflecting layer is disposed on the light transmissive member, bonding the light extracting surface of the light emitting elements to the light transmissive member, and singulating the light emitting devices. Thus, light emitting devices with a high light extracting efficiency can be manufactured efficiently.

BRIEF DESCRIPTION OF THE DRAWINGS

FIGS. 3A to 3H are schematic diagrams schematically showing a first method of manufacturing a light emitting device according to an embodiment.

FIGS. 4A to 4H are schematic diagrams schematically showing a second method of manufacturing a light emitting device according to an embodiment.

FIGS. 5A to 5G are schematic diagrams schematically showing a third method of manufacturing a light emitting device according to an embodiment.

DETAILED DESCRIPTION

Figure 1:
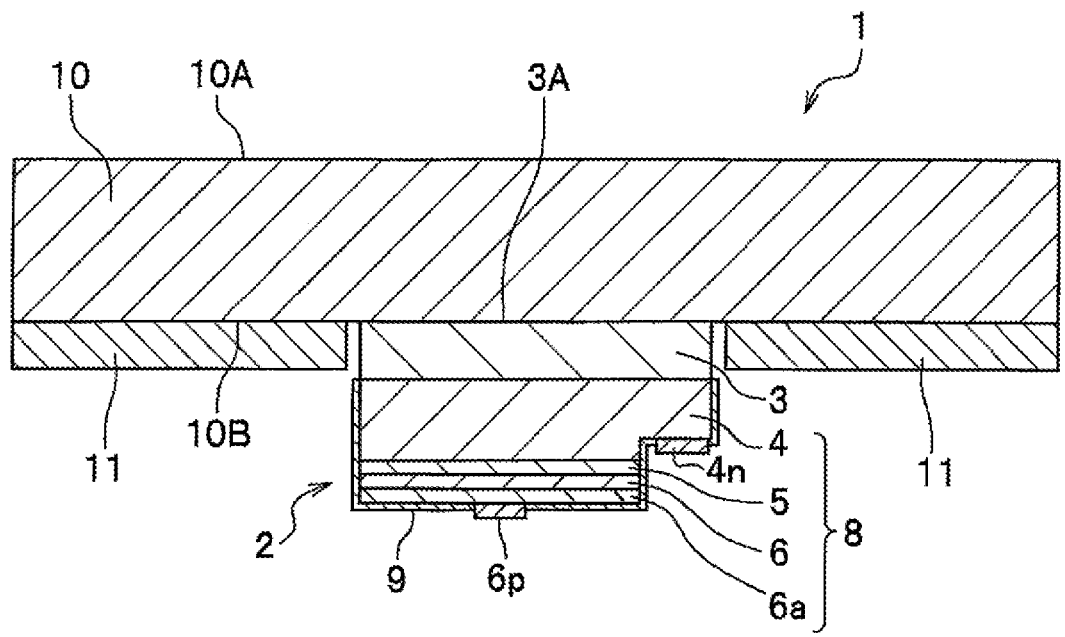
FIG. 1 is a cross-sectional view schematically showing a configuration of a light emitting device according to an embodiment of the present invention.

Embodiments of the present invention will be described below with reference to the drawings. The sizes and the arrangement relationships of the members in each of drawings are occasionally shown exaggerated for ease of explanation. In the description below, the same designations or the same reference numerals denote the same configuration, member or like members and duplicative descriptions will be appropriately omitted. Also, in each configuration, the terms "layer" and "film" differ only in various ways of explanation, and not by the thickness or the range to be disposed.

Configuration of Light Emitting Device

As shown in FIG. 1, a light emitting device 1 includes a light emitting element 2 which is a semiconductor light emitting element such as an LED, a light-transmissive member 10 disposed on the light extracting surface 3A of the substrate 3 having the light emitting element 2 disposed thereon, and a reflecting layer 11 is disposed on the element bonding surface 10B of the light transmissive member 10.

The light emitting element 2 will be illustrated with an LED chip which is mounted in a flip-chip manner (face-down mounting) which includes an n-side electrode (n-side pad electrode 4n) and a p-side electrode (p-side whole surface electrode 6a and a p-side pad electrode 6p), disposed on a first surface side of the semiconductor stacked layer structure 8. It is suitable that such a light emitting element 2 includes a light emitting layer of a semiconductor such as ZnS, SiC, GaN, GaP, InN, AN, ZnSe, GaAsP, GaAlAs, InGaN, GaAlN, AlInGaP, or AlInGaN, formed on a substrate 3 by using, such as a liquid phase growing method, an HDVPE method, or a MOCVD method. The light emitting element 2 includes a semiconductor stacked layer structure 8 formed on a substrate 3 of a light transmissive sapphire substrate.

The semiconductor stacked layer structure 8 includes, for example, an n-type semiconductor layer 4 formed on the substrate 3, a p-type semiconductor layer 6 formed on the n-type semiconductor layer 4, an active layer 5 formed between the n-type semiconductor layer 4 and the p-type semiconductor layer 6, and a p-side whole surface electrode layer 6a formed on the p-type semiconductor layer 6. Further, in the semiconductor stacked layer structure 8, on a portion of the n-type semiconductor layer 4 where the p-type semiconductor layer 6 is not stacked, an n-side pad electrode 4n is formed and also a p-side pad electrode 6p is formed protruding over the p-side whole surface electrode 6a. Further, in the semiconductor stacked layer structure 8, a protective film 9 is disposed so that a portion of the n-side pad electrode at the connecting end surface side of the n-side pad electrode 4n and a portion of the p-side pad electrode 6p at the connecting end surface side of the p-side pad electrode 6p are exposed.

The light emitting element 2 is configured to have a light extracting surface 3A at one side of the substrate 3, and the emission wavelength can be selected variously from ultra-violet light to infrared light by selecting the materials of the semiconductor layer and the ratio of the mixed crystals.

Examples of the material of the light emitting layer include $In_XAl_YGa_{1-X-Y}N$ ($0 \leq X \leq 1$, $0 \leq Y \leq 1$, $X+Y \leq 1$).

The light emitting element 2 is bonded to approximately center of the light transmissive member 10 with the light extracting surface 3A of the substrate 3. In the case where the light emitting element 2 is bonded to the light transmissive member 10, for example, the surface of the bonding position 10b (see FIGS. 3A through 3H) of the element bonding surface 10B of the light transmissive member 10 can be activated by a high-speed electron beam, and directly bonded by contacting/pressing.

The light transmissive member 10 is formed on the light emitting element 2 in a layer-shape (film-shape) or a plate-shape, and for example, preferably made of an inorganic dielectric material or an organic inorganic hybrid material using at least one of $SiO_2$, SiON, $TiO_2$, $Al_2O_3$. The inorganic dielectric material using the material described above can be disposed by using CVD (Chemical Vapor Deposition), sputtering, vapor deposition, ALD (Atomic Laser Deposition), or the like. Examples of organic compositions for the organic inorganic hybrid materials include polyethylene, polypropylene, polystyrene, nylon, polycarbonate, polyethylene terephthalate, and polyimide. The organic inorganic hybrid material using the material described above can be disposed by using sol-gel method, in-situ polymerization method, solid reaction method, or the like.

The light transmissive member 10 is preferably formed with using the materials described above, but the materials are not limited thereto. For example, any material can be used as long as it is transparent to the wavelength of the LED and has a refractive index approximately similar to the refractive index of the fluorescent material layer 20 which is an optical member to be bonded with. Also, the light transmissive member 10 preferably has a thickness which allows flattening by polishing or the like, after being disposed.

The light transmissive member 10 is for improving the extraction efficiency of the light from the light emitting element 2. The light transmissive member 10 has a refractive index which is the same as or greater than the refractive index of the portion (the substrate member 3) of the light emitting element which is bounded to the light transmissive member 10, and formed with a planar dimension greater than the planar dimension of the light extracting surface 3A of the light emitting element 2 in a plan view. The light transmissive member 10 is, for example, formed with a planar dimension in a range of 1.1 to 5 times greater than the planar dimension of the light extracting surface 3A of the light emitting element 2, and in a position-matched state with the light emitting element 2 at an approximately the center. The light transmissive member 10 is, for example, formed with a thickness of 50 to 200 μm, and in a quadrilateral shape such as a rectangular shape or a square shape, with a long side or a side of 2 to 5 mm.

More specifically, the refractive index of the light transmissive member 10 is preferably about 1.4 to about 2.0. With the refractive index of the light transmissive member 10 in a range as described above, total reflection or the like of light, which occurs at an intersection can be securely decreased. Also, the refractive index of the light transmissive member 10 can be appropriately adjusted, by selecting the materials and the conditions for forming the layer, in view of the transmittance of the light.

For example, the refractive index of SiO (more specifically, $SiO_2$, for example) may be 1.41, the refractive index of SiN (more specifically, $Si_3N_4$, for example) may be 2.0, and the refractive index of SiON (generally referred to as $SiO_xN_y$) may be an intermediate value of those. Accordingly, in the case where the light transmissive member 10 is formed by using, for example, CVD, approximately setting the content ratio of Si, O, and N, allows obtaining of the refractive index as approximately similar to that of the semiconductor stacked layer structure 8 or as approximately similar to that of the fluorescent material layer (optical member) 20 to be described below.

The refractive index of the light transmissive member 10 may be approximately similar to that of the substrate member 3 of the light emitting element 2, which abuts on the light transmissive member 10, or may be approximately similar to that of the fluorescent material layer 20 to be described below, to reduce the boundary of the refractive indexes. Accordingly, the total reflection of light which occurs at the interface between the substrate member 3 of the light emitting element 2 and the light transmissive member 10, or the interface between the light transmissive member 10 and the air can be reduced, and the light extraction efficiency can be improved. Herein, the expression "approximately similar" refers to a range, for example, within ±0.3, preferably ±0.1, more preferably ±0.05 of the refractive index of the substrate member 3 of the light emitting element 2.

The light transmissive member 10 is provided with a reflecting layer 11 at an element bonding surface 10B to which the light extracting surface 3A of the light emitting element 2 is bonded. The reflecting layer 11 is for reflecting and outputting the returning light from the light extracting surface 10A of the light transmissive member 10. The reflecting layer 11 is disposed on the element bonding surface 10B of the light transmissive member 10, at a location close to (abutting to) and a periphery of the light emitting element 2. The reflecting layer 11 can be disposed abutting (being adjacent) to a side surface of the light emitting element 2 (in other words, abutting to the substrate member 3 or the protective film 9), or as shown in FIG. 1, may be disposed without being in contact with but at a periphery of the light extracting surface 3A of the light emitting element 2. That is, with the use of the method of manufacturing described below, the reflecting layer 11 is disposed at a periphery of the light extracting surface 3A of the light emitting element 2 with a gap within an allowable range in the manufacturing.

The reflecting layer 11 is, for example, made of a dielectric multilayer film. The dielectric multilayer film is, for example, a multilayer made of $SiO_2/Nb_2O_5$. The reflecting layer 11 more preferably has a configuration in which a dielectric multilayer film is disposed and a metal film is further provided. Examples of the metal film include Ag, Al, and Rh. Further, in the case where the reflecting layer 11 is provided with a metal film, a protective layer ($SiO_2$) is preferably disposed on the metal film Thus, the reflecting layer 11 includes a configuration, for example, from the element bonding surface 10B of the light transmissive member 10, two or more layers of $SiO_2/Nb_2O_5$ (10 layers, 20 layers, 30 layers, 40 layers, 45 layers, or 50 layers) such as $SiO_2/Nb_2O_5/SiO_2/Nb_2O_5/\ldots SiO_2/Nb_2O_5/Ag/SiO_2$. The reflecting layer 11 may have, for example, next to a stack of 41 layers of dielectric layers, an Ag layer which is a metal film is stacked, and further, and further, a $SiO_2$ layer which is a protective layer is stacked on the Ag layer.

Figure 2:
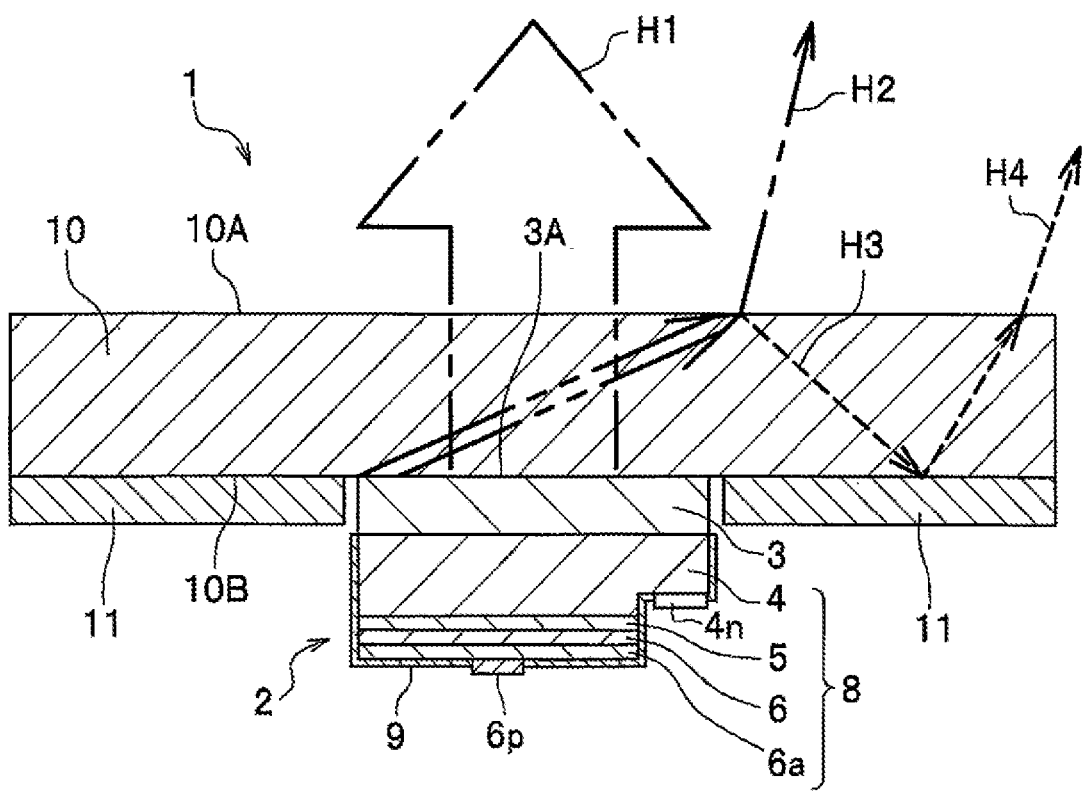
FIG. 2 is a schematic diagram schematically showing an output of light of a light emitting device according to the present invention, which is returned after being reflected at the interface.

The light emitting device 1 having a structure as described above, light emitted from the light emitting element 2 travels an optical path as shown in FIG. 2 and is outputted to outside from the light extracting surface 10A of the light transmissive member 10. As shown in FIG. 2, many portion of the light emitted from the light emitting element 2 of the light emitting device 1 is, as indicated by the arrow H1 in the two-dot chain line, passing through the light transmissive member 10 and is outputted (emitted) from the light extracting surface 10A. Further, a portion of light (arrow H3) emitted from the light emitting element 2 is reflected at the interface between the light extracting surface 10A of the light transmissive member 10 and the air and return toward the light emitting element 2.

As indicated by the arrow H3, a portion of light may return to a location deviated from the light extracting surface 3A of the light emitting element 2. In the light emitting device 1, the reflecting layer 11 is disposed on the element bonding surface 10B of the light transmissive member 10 which has a wider area than the light extracting surface of the light emitting element 2, so that the return light which is shown by the arrow H3 can be reflected at the reflecting layer 11 to output from the light extracting surface 10A of the light transmissive member 10. In FIG. 2, for the sake of explanation, the origin of the arrow is schematically shown at the end of the light extracting surface 3A of the light emitting element 2, but the origin of the arrow may be any points on the light extracting surface. Also, in the light emitting device 1, the reflecting layer 11 has a metal film such as an Ag layer, which allows for obtaining of a higher reflection efficiency, which allows for further improvement of the light extraction efficiency.

Method of Manufacturing Light Emitting Device. Next, a first method of manufacturing to a third method of manufacturing a light emitting device will be described with reference to FIG. 3A to FIG. 5G. In the description below, the light transmissive member 10 prior to singulation is referred to as "light transmissive material 100" and the reflecting layer 11 prior to singulation is referred to as "dielectric multilayer film 111". First, as shown in FIGS. 3A and 3B, in the first method of manufacturing, a sheet-shaped light transmissive material 100 for a light transmissive member 10 is formed (S1), and a dielectric multilayer film 111 for a reflecting layer 11 is disposed on the whole upper surface of the light transmissive material 100 (disposing reflective layer: S2). The dielectric multilayer film 111 can be disposed by using an appropriate method such as vapor deposition, sputtering, or CVD.

Next, as shown in FIG. 3C, in the first method, a mask M is disposed on the dielectric multilayer film 111 (S3) except for the locations where the light emitting elements 2 to be disposed in a later process by way of for example patterning. Then, as shown in FIGS. 3D and 3E, in the first method of manufacturing, portions of the dielectric multilayer film 111 which do not covered with the mask M are removed by etching (S4). Further, the mask M is disposed so that at the time of etching, alignment marks (alignment pattern) Ap which to be used in a later process are formed by portions of the dielectric multilayer film 111 (at positions on the light transmissive material 100 not to disturb binding of the light emitting elements 2). Then, the mask M is removed to form the bonding positions 10b of the light emitting elements 2 on the element bonding surface 10B of the light transmissive material 100 (preparing bonding positions: S5). At the same time, the alignment marks Ap are formed by using portions of the dielectric multilayer film 111.

Next, as shown in FIG. 3F, the light emitting elements 2 which are previously prepared in the state of being disposed spaced apart with each other on the support substrate KB via an adhesive layer ad, at respective positions corresponding to the bonding positions 10b of the light transmissive material 100 on the support substrate KB are placed on the light transmissive material 100 with positional matching the alignment marks on the support substrate KB and the alignment marks Ap on the dielectric multilayer film 111. Then, the light emitting elements 2 on the support substrate KB are placed facing the respective bonding positions 10b. Further, irradiating a high speed electron beam on the bonding positions 10b to activate the bonding positions 10b and the light extracting surface 3A of the light emitting elements 2 are directly bonded on the bonding positions 10b of the light transmissive material 100 (S6). Then, the light emitting elements 2 are detached from the adhesive layer ad of the support substrate KB to remove the light emitting elements 2 from the support substrate KB (see FIG. 3G), and the light emitting elements 2 and the light transmissive material 100 are bonded (Bonding light emitting element: S7).

Next, as shown in FIG. 3H, singulation is performed by using a known technique such as dicing so that the light transmissive material 100 having each of the light emitting elements 2 bonded thereon is larger than the light extracting surface 3A of the light emitting element 2 (Singulation: S8). With the singulation, the light extracting surface 3A of the light emitting element 2 is bonded to the element bonding surface 10B of the light transmissive member 10 to form a light emitting device 1 in which the reflecting layer 11 is disposed on the element bonding surface 10B around the light emitting element 2.

The light emitting device manufactured as described above allows the return light from the light extracting surface 10A of the light transmissive member 10 to be reflected at the reflecting layer 11 and emitted to outside from the light extracting surface 10A.

Next, the second method of manufacturing a light emitting device 1 will be described with reference to FIG. 4A through FIG. 4H. As shown in FIGS. 4A, 4B, in the second method of manufacturing, a sheet-shaped light transmissive material 100 for a light transmissive member 10 is formed (S11), and a mask M is disposed (S12) on the light transmissive material 100 at the locations where the light emitting elements 2 to be bonded in a later process. Further, a portion of the mask M on the light transmissive material 100 at a position not to disturb binding of the light emitting elements 2 is used for the sake of the alignment mark Ap so as to form the alignment marks (alignment pattern) Ap which is needed in a later process. Then, as shown in FIG. 4C, a dielectric multilayer film 111 for a reflecting layer 11 is disposed on the entire surface at one side of the light transmissive material 100 which is provided with the mask M (Disposing reflecting layer: S13). As shown in FIGS. 4D, 4E, the mask M is removed by using lift-off (S14) to form the bonding positions 10b of the light emitting elements 2 (Forming bonding positions: S15). With the lift off, the alignment marks Ap can be also formed in the same operation by portions of the dielectric multilayer film.

Next, as shown in FIG. 4F, the light emitting elements 2 which are previously prepared in the state of being disposed spaced apart with each other on the support substrate KB via an adhesive layer ad, at respective positions corresponding to the bonding positions 10b of the light transmissive material 100. Then, the alignment marks of the support substrate KB are matched with the alignment marks formed with the dielectric multilayer film 111 to align the positions. Then, the light emitting elements 2 on the support substrate KB are placed facing the respective bonding positions 10b. Further, irradiating a high speed electron beam on the bonding positions 10b to activate the bonding positions 10b and the light extracting surface 3A of the light emitting elements 2 are directly bonded on the bonding positions 10b of the light transmissive material 100 (S16). Then, the light emitting elements 2 are detached from the adhesive layer ad of the support substrate KB to remove the light emitting elements 2 from the support substrate KB (see FIG. 4G), and the light emitting elements 2 and the light transmissive material 100 are bonded (Bonding light emitting element: S17).

Next, as shown in FIG. 4H, singulation is performed by using a known technique such as dicing so that the light transmissive material 100 having each of the light emitting elements 2 bonded thereon is larger than the light extracting surface 3A of the light emitting element 2 (Singulation: S18). With the singulation, the light extracting surface 3A of the light emitting element 2 is bonded to the element bonding surface 10B of the light transmissive member 10 to form a light emitting device 1 in which the reflecting layer 11 is disposed on the element bonding surface 10B around the light emitting element 10B.

Next, the third method of manufacturing will be described with reference to FIG. 5A through FIG. 5G. First, as shown in FIGS. 5A, 5B, in the present method of manufacturing, a sheet-shaped light transmissive material 100 for a light transmissive member 10 is formed (S21) and to the bonding positions 10b of the light transmissive material 100, respective light emitting elements 2 which are previously disposed on the support substrate KB via the mask (resist) M with the use of an adhesive layer ad, are faced to the respective bonding positions 10b of the light transmissive material 100. Then, the alignment marks of the support substrate KB and the alignment marks of the light transmissive material 100 are aligned with each other, to match the bonding positions of the light emitting elements 2. Further, irradiating a high speed electron beam on the bonding positions 10b to activate and the light extracting surface 3A of the light emitting elements 2 are directly bonded on the bonding positions 10b (S22). Then, as shown in FIG. 5C, the mask M and the light emitting elements 2 are separated from the adhesive layer ad of the support substrate KB, to bond the mask M and the light emitting elements 2 with the light transmissive material 100 (Bonding light emitting elements: S23).

Then, as shown in FIG. 5D, a dielectric multilayer film 111 is disposed on the light transmissive material 100 and the mask M (Disposing reflecting layer: S24). Then, as shown in FIGS. 5E, 5F, by way of lift-off, portions of the mask M on the light emitting elements 2 and portions of the dielectric multilayer film 111 on the mask M are removed (Removing: S25), to dispose the light emitting elements 2 on the light transmissive material 100 (S26). Next, as shown in FIG. 5G, singulation is performed by using a known technique such as dicing so that the light transmissive material 100 having each of the light emitting elements 2 bonded thereon is larger than the light extracting surface 3A of the light emitting element 2 (Singulation: S27). With the singulation, the light extracting surface 3A of the light emitting element is bonded to the element bonding surface 10B of the light transmissive member 10 to form a light emitting device 1 in which the reflecting layer 11 is disposed on the element bonding surface 10B around the light emitting element 2.

The light emitting device 1 manufactured as described above allows the return light from the light extracting surface 10A of the light transmissive member 10 to be reflected at the reflecting layer 11 and emitted to outside from the light extracting surface 10A. The light emitting device 1 is illustrated with a configuration in which light is extracted to outside from the light extracting surface 10A opposite side of the element-bonding surface of the light transmissive member 10, but the light emitting device 1A may also be employed in which a fluorescent material layer 20 on the light extracting surface 10A of the light transmissive member 10. In the below, the light emitting device 1A will be described with reference to FIG. 6. In the description below, the same reference numerals will be applied to the configurations described above and description thereof will be appropriately omitted.

Figure 6:
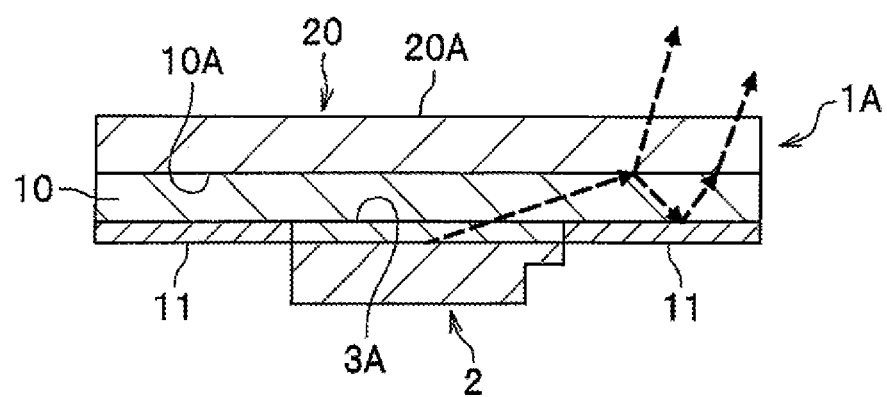
FIG. 6 is a schematic diagrams schematically showing another configuration a light emitting device according to an embodiment.

As shown in FIG. 6, the light emitting device 1A includes a light emitting element 2, a light transmissive member 10 disposed on the light extracting surface 3A of the light emitting element 2, and a fluorescent material layer 20 disposed on the light extracting surface 10A of the light transmissive member 10, and a reflecting layer 11 is disposed at a position corresponding to the periphery of the light emitting element 2 on the element bonding surface 10B of the light transmissive member 10. The fluorescent material layer 20 serves to apply a predetermined effect, for example, converting the wavelength of light or randomly reflecting light, on the light emitted from the light extracting surface 10A of the light transmissive member 10. The fluorescent material layer 20 is disposed with an approximately similar planar dimension as that of the light transmissive member 10 in a plan view. Further, the fluorescent material layer 20 is preferably directly disposed on the light extracting surface 10A of the light transmissive member 10 by using normal-temperature bonding. The fluorescent material layer 20 may be of any appropriate type as long as it is made of a combination of a fluorescent material for absorbing at least part of light from the light emitting element 2 and a member which is transmissive to a light having a desired wavelength to be obtained from the light emitting device 1A.

The fluorescent material layer 20 includes a fluorescent material which allows obtaining of a desired color of light with a combination of the light extracted from the semiconductor stacked layer structure 8 of the light emitting element 2. A generally used fluorescent material such as an oxide-based fluorescent material, a nitride-based fluorescent material, and/or an oxynitride fluorescent material can be employed. Examples of such fluorescent materials include a YAG-based fluorescent material of a YAG (yttrium-aluminum-garnet) activated with Ce or the like, a nitride-based fluorescent material or an oxynitride-based fluorescent material activated with a lanthanoid series element such as Eu, Ce. The fluorescent material layer 20 may be formed in a fluorescent material plate, and an inorganic material such as a glass formed integrally with those fluorescent materials by sintering can be used. The optical member of the fluorescent material layer 20 preferably has a refractive index approximately similar to or the same as the refractive index of the light transmissive member 10. The fluorescent material layer 20 is, for example, formed with a thickness of 50 to 200 μm, and in a quadrilateral shape such as a rectangular shape or a square shape, with a long side or a side of 2 to 5 mm.

In the light emitting device 1A having the fluorescent material layer 20, as indicated by dashed arrows, light emitted from the light emitting element 2 propagates through the light transmissive member 10 and also propagates through the fluorescent material layer 20, and is emitted from the light extracting surface 20A of the fluorescent material layer 20. At this time, in the light emitting device 1A, a part of light may be reflected at an interface between the light transmissive member 10 and the fluorescent material layer 20, or at the light extracting surface 20A of the fluorescent material layer 20 which is an interface with the atmosphere, and returns. The returned light is reflected again at reflecting layer 11 to the light extracting surface 20A of the fluorescent material layer 20 and is outputted. Thus, because the reflecting layer 11 is disposed on the light transmissive member 10, even the light which returns to a location deviated from the light extracting surface 3A of the light emitting element 2 can be reflected again and extracted. Accordingly, the light emitting device 1A can achieve a higher light extracting efficiency compared to that of the light emitting devices with a conventional configuration.

Figure 7:
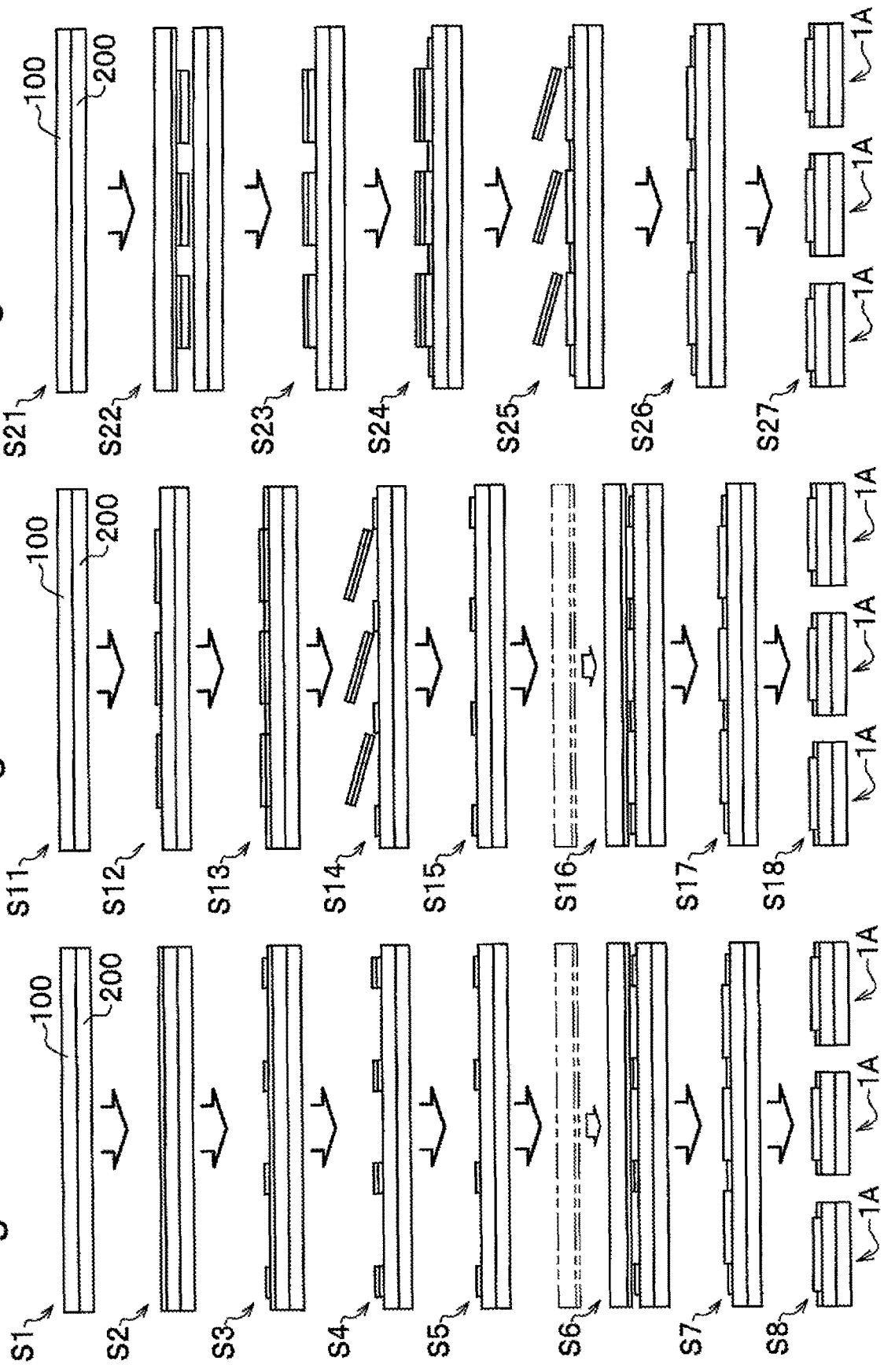
FIGS. 7A to 7C are schematic diagrams schematically showing a first to third method of manufacturing a light emitting device according to an embodiment.

The light emitting device 1A having the fluorescent material layer 20 can be manufactured by a method similar to that described above. More specifically, as shown in FIGS. 7A to 7C, an optical material 200 for the fluorescent material layer 20 is disposed on the whole upper surface of one side of the light transmissive material 100 for the light transmissive members 10, prepared at an early stage in the first method of manufacturing to the third method of manufacturing. Then, with respectively performing each operation of S1 to S8 of the first method of manufacturing, S11 to S18 of the second method of manufacturing, and S21 to S27 of the third method of manufacturing, the light emitting devices 1A can be manufactured.

Figure 8:
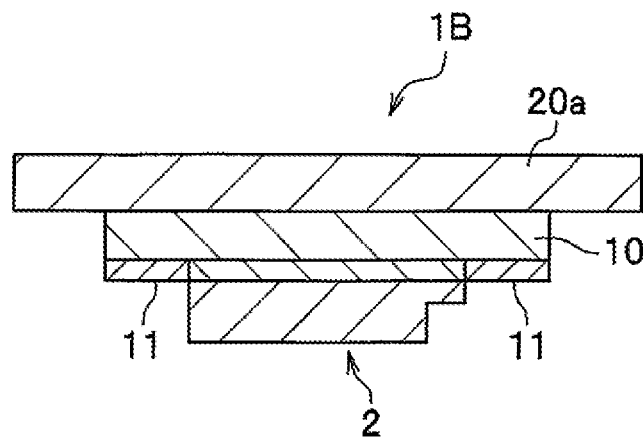
FIG. 8 is a cross-sectional view schematically showing another configuration of a light emitting device according to an embodiment of the present invention.

Illustrated as the light emitting device 1B shown in FIG. 8, another configuration may have a fluorescent material layer 20a formed with a width greater than the width of the light transmissive member 10 in a plan view. As described above, forming the fluorescent material layer 20a larger than the light transmissive member 10 allows inclusion of the light emitted from the periphery of the light transmissive member 10 into the fluorescent material layer 20 to emit, so that the light extraction efficiency can be further improved. The fluorescent material layer 20a is, for example, formed larger than the light transmissive member 10, by 50 μm or greater at each side with respect to that of the light transmissive member 10.

Figure 9:
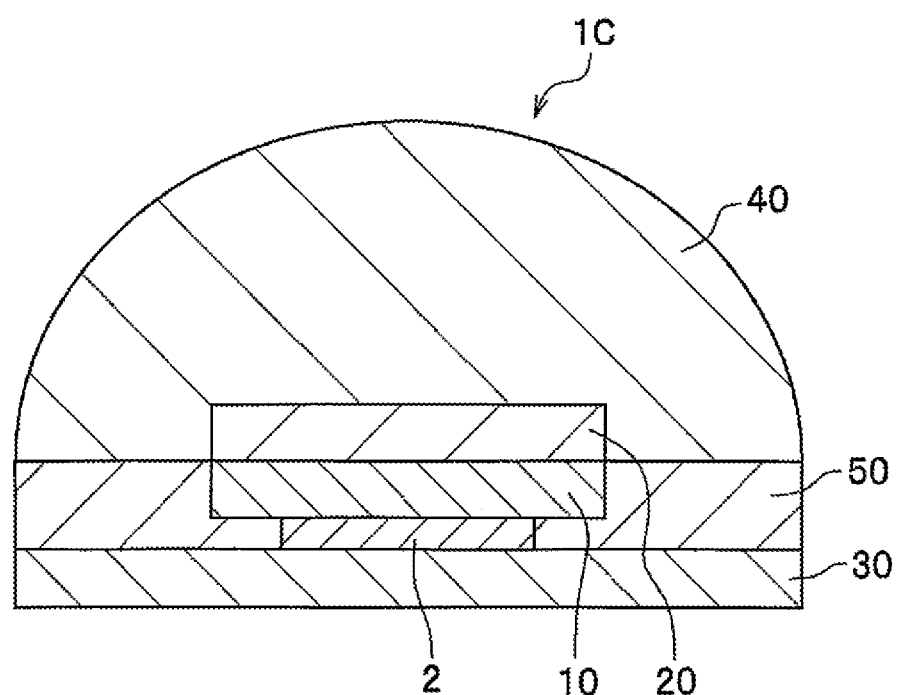
FIG. 9 is a cross-sectional view schematically showing another configuration of a light emitting device according to an embodiment of the present invention.

As a lens-type light emitting device 1C shown in FIG. 9, another configuration may include the n-side pad electrode 4n and the p-side pad electrode 6p of the light emitting element 2, bonded to the mounting substrate 30 by using a bonding member such as a bump, and a lens 40, as a sealing member, disposed at the fluorescent material layer 20 side, and a reflecting material 50 filled between the mounting substrate 30 and the lens 40. In the lens-type light emitting device 1C, as described above, the filled reflecting material 50 serves as the reflecting layer 11. Thus, the light extraction efficiency from the lens 40 can be improved. As the sealing member, the lens 40 may be made of sapphire, GaN, glass, a resin, or the like, and may also contain a fluorescent material. With the use of the lens 40, the light can be refracted to be concentrated or scattered.

Further, the respective configuration of the light emitting devices 1, 1A, 1B, and 1C may be those described below. The substrate member 3 which is bonded to the light transmissive member 10 is explained as a sapphire substrate member, but for example, GaN which is equivalent to the semiconductor stacked layer structure 8 is used, the light transmissive member 10 with a refractive index equivalent to or greater than that of GaN may be employed. Thus, the light transmissive member 10 can be appropriately selected according to the member to be bonded with.

Examples for direct bonding of the light emitting element 2 and the light transmissive member 10 or the light transmissive material 100 include surface activated bonding, atomic diffusion bonding, and hydroxyl bonding, and one of those can be selectively used. The surface activated bonding is a bonding technique in which impurities such as oxides, moisture, organic matters which are attached to each surface layer of the members to be bonded are removed together with a part of respective surface layers, and bonding hands of the atoms of the surfaces are directly bonded at normal temperature (Reference: WO 2011/126000 A1). The atomic diffusion bonding is a bonding technique in which a microcrystalline film is formed on the surfaces of each of the members to be bonded under ultrahigh vacuum, and those thin films are overlapped and then bonded in vacuum. The hydroxyl bonding is a bonding technique in which the surfaces of the members to be bonded are subjected to hydrophilization treatment to form hydroxy groups (—OH groups) and the bonding surfaces are made in contact with each other, then, the members are bonded through the hydrogen bonds between the respective hydroxy groups.

The reflecting layer 11 is explained as a dielectric multilayer film, which may include a metal film and/or a protective layer. But the reflecting layer may be made singly of a dielectric multilayer film, singly of a metal film, a dielectric multilayer film and a protective layer, a metal film and a protective layer, or made of a material which can scatter/reflect light, such as a white resin layer, a coated layer, or the like. In the light emitting devices 1A, 1B, the fluorescent material layer 20 is illustrated as a specific example of the optical member, but it is not limited to the fluorescent material layer 20, the examples thereof can also include a fluorescent material plate, a sapphire substrate, a GaN substrate, and a lens, and one of those may be employed in the configuration.

Also, for example, in the case where a sapphire substrate member is used for the optical member, the sapphire substrate member may be made in a planar member, and in the case where a GaN substrate member is used, the GaN substrate member may be made in a planar member. Bonding those substrate members on the light transmissive member 10 allows an increase of the thickness as the light propagation layer of the light emitting devices 1A, 1B. Accordingly, in the light emitting devices 1A, 1B, the number of reflections of optical multiple reflections in the respective light emitting devices can be reduced, and optical confinement and optical absorption can be suppressed. The optical member preferably has a refractive index approximately similar to or the same as the refractive index of the light transmissive member 10. The material of the adhesive layer ad applied on the support substrate KB can be a photocurable resin for example, and a known adhesive agent can be appropriately employed.

Figure 10A:
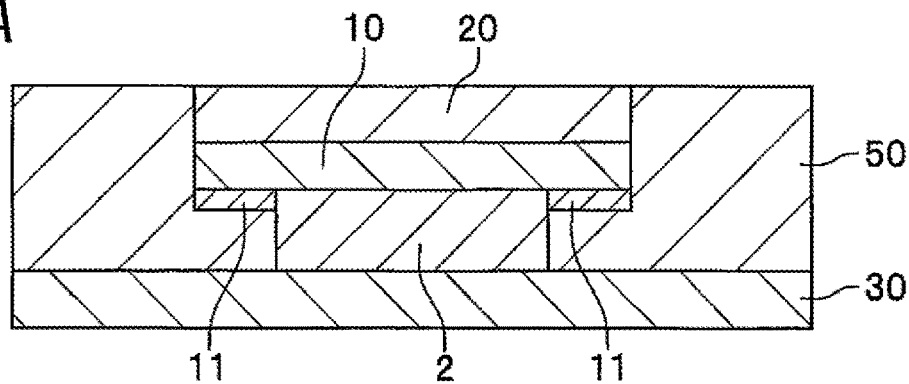
FIGS. 10A to 10D are cross-sectional views each schematically showing a configuration of a light emitting device according to an embodiment of the present invention.
Figure 10B:
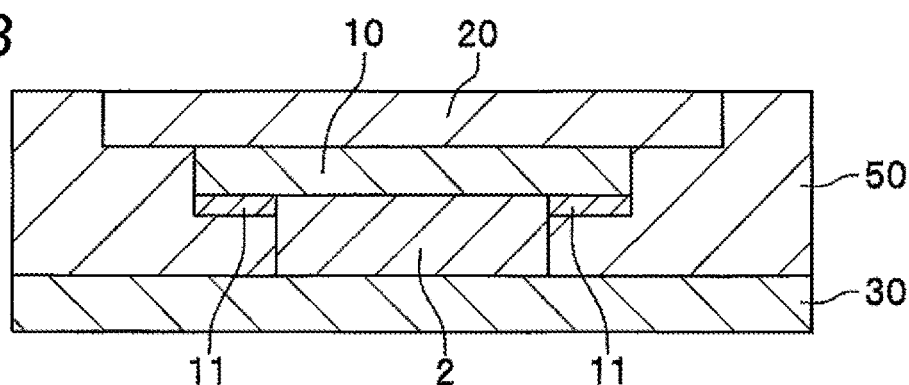

Further, the configuration of the light emitting device 1C may be those described below. In the light emitting device 1C shown in FIG. 9, a configuration without a lens 40, or a configuration in which, regardless of the presence of the lens 40, the reflecting material 50 covers not only the side surfaces of the light transmissive member 10 but also the side surfaces of the fluorescent material layer 20, may also be employed. Also, in the configuration of the light emitting devices 1A, 1B, if leakage of light from a side surface of the bonded light emitting element 2 is liable to occur, as shown in FIGS. 10A, 10B, the leakage of light can be prevented with a configuration in which the side surfaces of the light emitting element 2 in the light emitting devices 1A, 1B are covered with the reflecting material 50.

In the case where a resin and/or a white scattering material (titania or the like) contained in the reflecting material 50 absorbs the light from the light emitting element 2, the portions of the light transmissive member 10 are preferably covered with both the reflecting layer 11 and a reflecting material 50 than only with the reflecting material 50 shown in FIG. 9. That is, the light emitting device 1C shown in FIG. 9 also preferably has a configuration as shown in FIGS. 10A to 10D, that the reflecting material 50 coves the reflecting layer 11 disposed on the light transmissive member 10. With this arrangement, the light extracting efficiency of the light emitting device can be improved. In the case where both the reflecting layer 11 and the reflecting material 50 are provided, the effect of reflecting light as a reflecting material 50 may be small at the reflecting layer-side and may be greater at the side surfaces of the light emitting element 2.

Figure 10C:
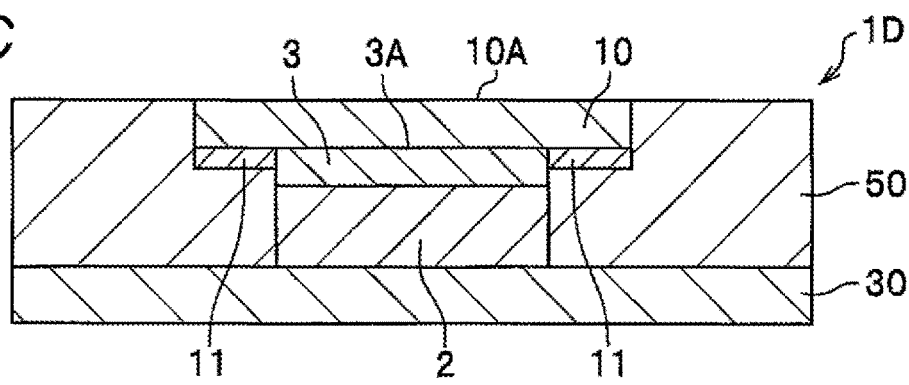
Figure 10D:
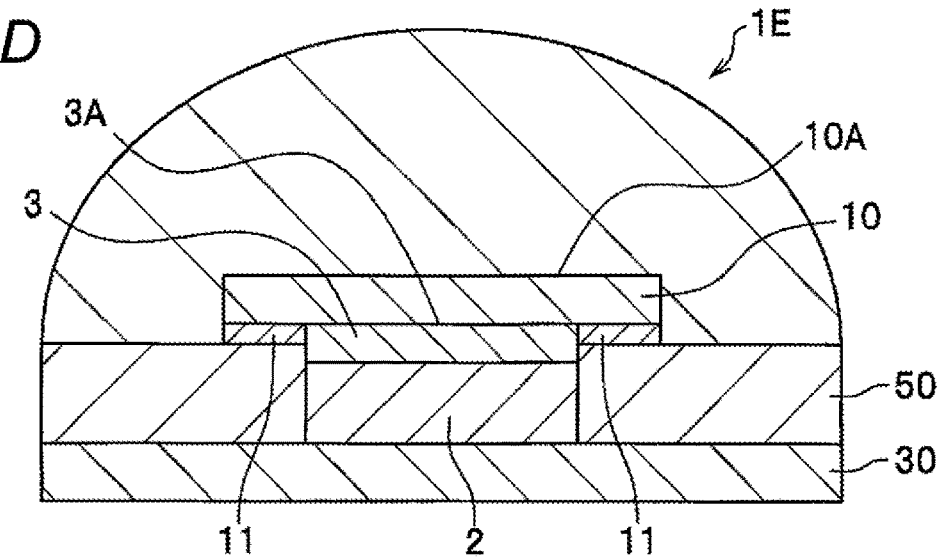

Further, as shown in FIG. 10C, the light emitting device 1 described referring to FIG. 1 may be provided with the mounting substrate 30 and the reflecting material 50 described referring to FIG. 9 to obtain a device 1D. Also, as shown in FIG. 10D, the light emitting device 1 described referring to FIG. 1 may be provided with the mounting substrate 30 the reflecting material 50, and the lens 40 described referring to FIG. 9 to obtain a device 1E.

INDUSTRIAL APPLICABILITY

Embodiments of the present invention can be utilized for various kinds of light sources, such as illumination light sources, light sources for various kinds of indicators, light sources for automobile use, light sources for displays, back light sources for liquid crystal displays, signals, automobile use, channel control characters for channel boards.

As described above, it should be obvious that various other embodiments are possible without departing the spirit and scope of the present invention. Accordingly, the scope and spirit of the present invention should be limited only by the following claims.

What is claimed is:

1. A light emitting device, comprising:
a light emitting element;
a first light transmissive member disposed over a light extracting surface side of the light emitting element, in a plan view, the first light transmissive member having a planar dimension greater than a light extracting surface of the light emitting element; and
a reflecting layer disposed on opposite surface of a light extracting surface of the first light transmissive member, and without being in contact with the light emitting element.

2. The light emitting device according to claim 1, wherein the first light transmissive member disposed over the light emitting element via a second light transmissive member.

3. The light emitting device according to claim 1, further comprising a fluorescent material layer disposed on the light extracting surface of the first light transmissive member.

4. The light emitting device according to claim 3, wherein the fluorescent material layer includes a planar dimension larger than the first light transmissive member in a plan view.

5. The light emitting device according to claim 1, wherein the reflecting layer includes a dielectric multilayer film.

6. The light emitting device according to claim 1, wherein the reflecting layer includes a dielectric multilayer film, and a metal film disposed on the dielectric multilayer film at an opposite side to the first light transmissive member.

7. The light emitting device according to claim 1, further comprising:
a mounting substrate disposed opposite side to the light extracting surface of the light emitting element; and
a reflecting material disposed to cover at least one from the group consisting of side surfaces of the light emitting element and side surfaces of the first light transmissive member.

8. The light emitting device according to claim 7, wherein the reflecting layer is made of a dielectric multilayer film and the reflecting material covers the dielectric multilayer film.

9. The light emitting device according to claim 3, further comprising:
a mounting substrate disposed opposite side to the light extracting surface of the light emitting element; and
a reflecting material disposed to cover at least one from the group consisting of side surfaces of the light emitting element, side surfaces of the first light transmissive member and side surfaces of the fluorescent material layer.

10. The light emitting device according to claim 9, wherein the reflecting layer is made of a dielectric multilayer film and the reflecting material covers the dielectric multilayer film.

11. The light emitting device according to claim 1, wherein the reflecting layer includes a white resin layer.

12. The light emitting device according to claim 3, wherein the fluorescent material layer is directly disposed on the light extracting surface of the first light transmissive member.

13. The light emitting device according to claim 2, wherein the reflecting layer has a thickness thinner than a thickness of the second light transmissive member.

14. The light emitting device according to claim 2, wherein the first light transmissive member has a refractive index substantially equal to or higher than a refractive index of the second light transmissive member.

15. The light emitting device according to claim 3, further comprising a lens covering a light extracting surface of the fluorescent material layer.

* * * * *